(12) United States Patent
Khlat et al.

(10) Patent No.: US 9,118,376 B2
(45) Date of Patent: Aug. 25, 2015

(54) CARRIER AGGREGATION FRONT END ARCHITECTURE

(71) Applicant: RF Micro Devices, Inc., Greensboro, NC (US)

(72) Inventors: Nadim Khlat, Cugnaux (FR); Marcus Granger-Jones, Scotts Valley, CA (US); Ruediger Bauder, Feldkirchen-Westerham (DE)

(73) Assignee: RF Micro Devices, Inc., Greensboro, NC (US)

( * ) Notice: Subject to any disclaimer, the term of this patent is extended or adjusted under 35 U.S.C. 154(b) by 189 days.

(21) Appl. No.: 13/848,393

(22) Filed: Mar. 21, 2013

(65) Prior Publication Data

US 2013/0250819 A1      Sep. 26, 2013

Related U.S. Application Data

(60) Provisional application No. 61/614,452, filed on Mar. 22, 2012, provisional application No. 61/792,786, filed on Mar. 15, 2013.

(51) Int. Cl.
| | |
|---|---|
| *H04B 1/10* | (2006.01) |
| *H04L 27/00* | (2006.01) |
| *H03H 7/46* | (2006.01) |
| *H03H 7/01* | (2006.01) |

(52) U.S. Cl.
CPC ............... *H04B 1/10* (2013.01); *H03H 7/465* (2013.01); *H04L 27/0002* (2013.01); *H03H 2007/013* (2013.01); *H03H 2210/025* (2013.01); *H03H 2210/033* (2013.01); *H03H 2210/036* (2013.01)

(58) Field of Classification Search
None
See application file for complete search history.

(56) References Cited

U.S. PATENT DOCUMENTS

2013/0016633 A1*   1/2013   Lum et al. ............... 370/277
2013/0241666 A1*   9/2013   Granger-Jones et al. ..... 333/101

\* cited by examiner

*Primary Examiner* — Kerri Rose
(74) *Attorney, Agent, or Firm* — Withrow & Terranova, P.L.L.C.

(57) ABSTRACT

Radio frequency (RF) front end circuitry includes a notch diplexer. The notch diplexer includes a high pass filter coupled between a high band port and an antenna port, and a low pass notch filter coupled between a low band port and the antenna port. The high pass filter is adapted to receive a high band receive signal having a high band carrier frequency at the antenna port, and pass the high band receive signal to the high band port. The low pass notch filter is adapted to receive a low band transmit signal having a low band carrier frequency at the low band port, and attenuate distortion in the low band transmit signal about a notch stop band before passing the low band transmit signal to the antenna port. According to one embodiment, the notch stop band includes the high band carrier frequency.

23 Claims, 12 Drawing Sheets

| Operating Band | Uplink (UL) Operating Band | Downlink (DL) Operating Band | Duplex Mode |
|---|---|---|---|
| 1 | 1920-1980 | 2110-2170 | FDD |
| 2 | 1850-1910 | 1920-1990 | FDD |
| 3 | 1710-1785 | 1805-1880 | FDD |
| 4 | 1710-1755 | 2110-2155 | FDD |
| 5 | 824-849 | 869-894 | FDD |
| 6 | 830-840 | 865-875 | FDD |
| 7 | 2500-2570 | 2620-2690 | FDD |
| 8 | 880-915 | 925-960 | FDD |
| 9 | 1749.9-1784.9 | 1844.9-1879.9 | FDD |
| 10 | 1710-1770 | 2110-2170 | FDD |
| 11 | 1427.9-1447.9 | 1475.9-1495.9 | FDD |
| 12 | 698-716 | 728-746 | FDD |
| 13 | 777-787 | 746-756 | FDD |
| 14 | 788-798 | 758-768 | FDD |
| 15 | Reserved | Reserved | - |
| 16 | Reserved | Reserved | - |
| 17 | 704-716 | 734-746 | FDD |
| 18 | 815-830 | 860-875 | FDD |
| 19 | 830-845 | 875-890 | FDD |
| 20 | 832-862 | 791-821 | FDD |
| 21 | 1447.9-1462.9 | 1495.9-1510.9 | FDD |
| 22 | 3410-3500 | 3510-3600 | FDD |
| ... | ... | ... | ... |
| 33 | 1900-1920 | 1900-1920 | TDD |
| 34 | 2010-2025 | 2010-2025 | TDD |
| 35 | 1850-1910 | 1850-1910 | TDD |
| 36 | 1930-1990 | 1930-1990 | TDD |
| 37 | 1910-1930 | 1910-1930 | TDD |
| 38 | 2570-2620 | 2570-2620 | TDD |
| 39 | 1880-1920 | 1880-1920 | TDD |
| 40 | 2300-2400 | 2300-2400 | TDD |
| 41 | 3400-3600 | 3400-3600 | TDD |

CARRIER AGGREGATION FRONT END ARCHITECTURE

RELATED APPLICATIONS

This application claims the benefit of U.S. provisional patent application No. 61/614,452, filed Mar. 22, 2012, and 61/792,786 filed Mar. 15, 2013, the disclosure of which is hereby incorporated by reference in its entirety.

FIELD OF THE DISCLOSURE

The present disclosure relates to radio frequency front end architectures suitable for carrier aggregation configurations.

BACKGROUND

Modern mobile telecommunications standards continue to demand increasingly greater rates of data exchange (data rates). One way to achieve a high data rate in a mobile device is through the use of carrier aggregation. Carrier aggregation allows a single mobile device to aggregate bandwidth across one or more operating bands in the wireless spectrum. The increased bandwidth achieved as a result of carrier aggregation allows a mobile device to obtain higher data rates than have previously been available.

Figure 1:
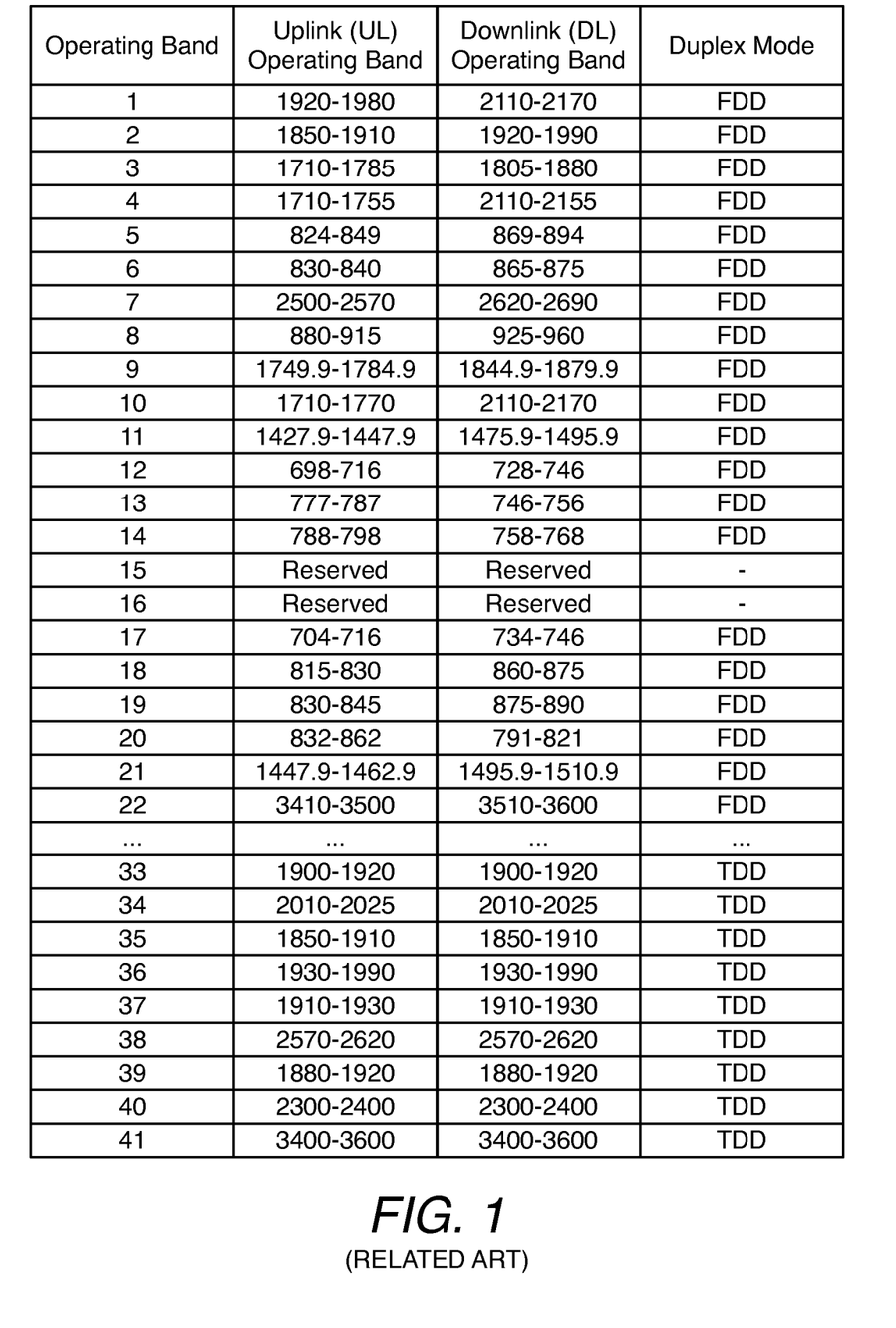
FIG. 1 is a table showing a number of wireless communications bands within the wireless spectrum.

FIG. 1 shows a table describing a number of wireless communications bands in the wireless spectrum. One or more of the wireless communications bands may be used, for example, in a CDMA, GSM, LTE, or LTE-advanced equipped mobile device. The first column indicates the operating band number for each one of the operating bands. The second and third columns indicate the uplink and downlink frequency bands for each one of the operating bands, respectively. Finally, the fourth column indicates the duplex mode for each one of the operating bands. In non-carrier aggregation configurations, a mobile device will generally communicate using a single portion of the uplink or downlink frequency bands within a single operating band. In carrier aggregation applications, however, a mobile device may aggregate bandwidth across a single operating band or multiple operating bands in order to increase the data rate of the device.

Figure 2A:
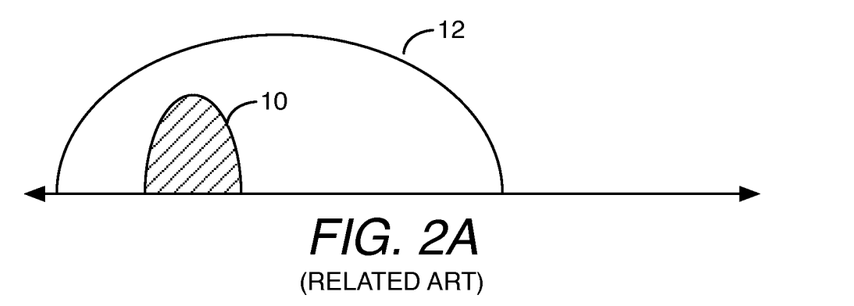
FIGS. 2A-2D are diagrams showing a variety of carrier aggregation configurations for use in a mobile terminal.

FIG. 2A shows a diagram representing a conventional, non-carrier aggregation configuration for a mobile device. In the conventional configuration, a mobile device communicates using a single portion of the wireless spectrum 10 within a single operating band 12. Under the conventional approach, the data rate of the mobile device is constrained by the limited available bandwidth.

Figure 2B:
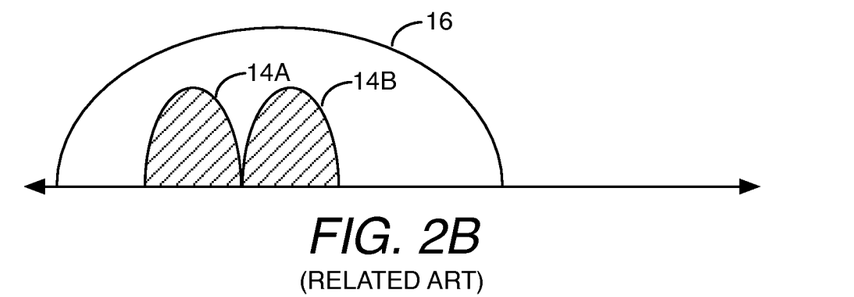
Figure 2C:
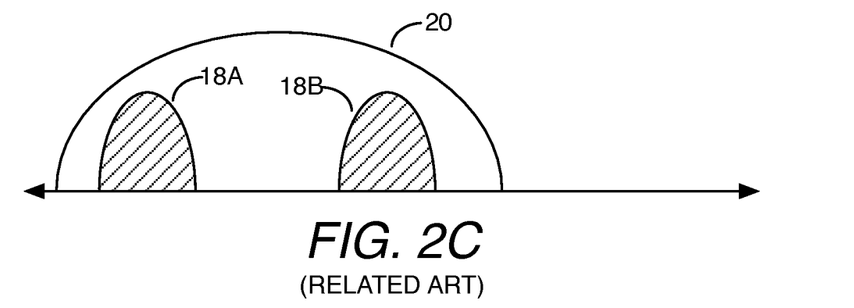
Figure 2D:
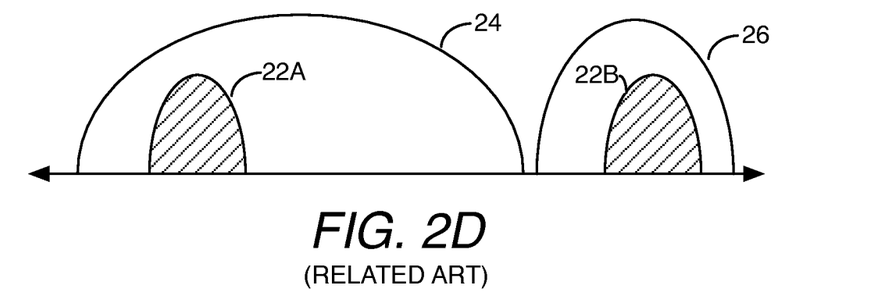

FIGS. 2B-2D show diagrams representing a variety of carrier aggregation configurations for a mobile device. FIG. 2B shows an example of contiguous, intra-band carrier aggregation, in which the aggregated portions of the wireless spectrum 14A and 14B are located directly adjacent to one another and are in the same operating band 16. FIG. 2C shows an example of non-contiguous intra-band carrier aggregation, in which the aggregated portions of the wireless spectrum 18A and 18B are located within the same operating band 20, but are not directly adjacent to one another. Finally, FIG. 2D shows an example of inter-band carrier aggregation, in which the aggregated portions of the wireless spectrum 22A and 22B are located in different operating bands 24, 26. It is advantageous for a modern mobile device to support each one of the previously described carrier aggregation configurations.

The use of carrier aggregation may pose unique problems for the front end circuitry in a mobile device. For instance, the use of carrier aggregation across certain operating bands may cause undesirable interference between transmit and receive circuitry in a mobile device front end that renders the mobile device unusable in these operating bands. Accordingly, the use of carrier aggregation in a mobile device may complicate the design of the front-end circuitry.

Figure 3:
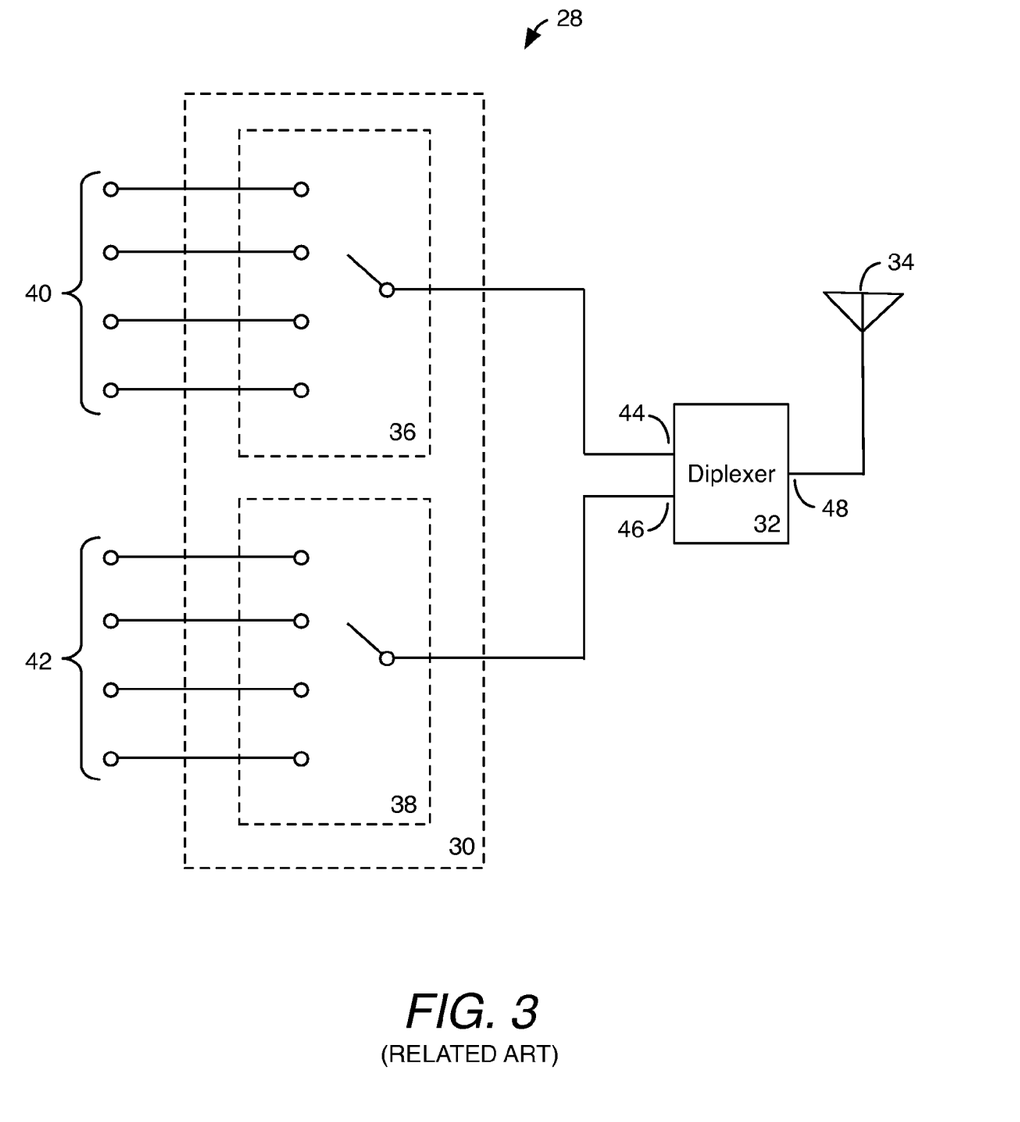
FIG. 3 is a schematic representation of conventional front end switching circuitry for use with a single antenna.

FIG. 3 shows conventional front end circuitry 28 for use in a mobile terminal. The conventional front end circuitry 28 includes antenna switching circuitry 30, a diplexer 32, and an antenna 34. The antenna switching circuitry 30 includes high band switching circuitry 36 and low band switching circuitry 38. The high band switching circuitry 36 is adapted to couple one of a plurality of high band RF front end ports 40 to the antenna 34 through the diplexer 32. The low band switching circuitry 38 is adapted to couple one of a plurality of low band RF front end ports 42 to the antenna 34 through the diplexer 32. The diplexer 32 includes a low band port 46 coupled to the low band switching circuitry 38, a high band port 44 coupled to the high band switching circuitry 36, and an antenna port 48 coupled to the antenna 34. The diplexer 32 is adapted to pass high band signals falling within a high pass band between the high band port 44 and the antenna port 48, pass low band signals falling within a low pass band between the low band port 46 and the antenna port 48, and attenuate signals outside of the respective high and low pass bands. Although effective at selectively placing the antenna 34 in communication with the appropriate RF front end port, in certain carrier aggregation configurations, the conventional front end circuitry 28 shown in FIG. 3 may suffer from undesirable interference between the transmit and receive signal paths within the high band switching circuitry 36 and the low band switching circuitry 38.

The antenna switching circuitry 30 may comprise a plurality of transistors and other assorted passive components. As is well known in the art, non-linearity of the transistors and other passive components within the antenna switching circuitry 30 may generate harmonic distortion about a passing signal. In certain carrier aggregation applications, the generated harmonic distortion can cause desensitization of receive circuitry in the conventional front end circuitry 28 illustrated in FIG. 3. For example, in a carrier aggregation configuration using bands 3 and 8 (CA 3-8), the conventional front end circuitry 28 will couple one of the low band RF front end ports 42 corresponding with the band 8 TX port to the low band port 46 of the diplexer 32 in order to transmit a carrier signal between 880-915 MHz. As the carrier signal passes through the low band switching circuitry 38, harmonic distortion is generated. The carrier signal and harmonic distortion travel through the diplexer 32, where the carrier signal is passed from the low band port 46 to the antenna port 48.

Although the carrier signal is at least partially filtered when passing through the diplexer 32, conventional diplexer circuitry may only partially attenuate harmonic distortion about the carrier signal. Because at least a portion of the second harmonic of the band 8 uplink signal (1760-1830 MHz) falls within the band 3 downlink signal (1805-1880 MHz), components of the harmonic distortion about the carrier signal are within the high pass band of the diplexer 32, and a portion of the harmonic distortion will be delivered to the high band switching circuitry 36. Further, because the conventional front end circuitry 28 is configured to simultaneously transmit on band 8 and receive on band 3 in a CA 3-8 configuration, one of the high band RF front end ports 40 corresponding with the band 3 will be coupled to the diplexer 32 through the high band switching circuitry 36. Accordingly, a portion of the high amplitude carrier signal about the second harmonic will be delivered to the band 3 receive circuitry, where it will cause desensitization. Additionally, the harmonic distortion in the carrier signal will be presented to the antenna 34, thereby degrading the quality of the transmission signal. As a result of the desensitization of the receive circuitry and the degraded quality of the transmission signal, the performance of the conventional front end circuitry 28 shown in FIG. 3 may suffer in a CA 3-8 configuration.

As an additional example, the conventional front end circuitry 28 will also experience problems in carrier aggregation applications using bands 4 and 17 (CA 4-17), because the third harmonic of band 17 (2112-2148 MHz) falls within band 4 (2110-2155 MHz). The problem with the conventional front end circuitry 28 may occur in any carrier aggregation configuration using operating bands in which the harmonic components of the carrier signal fall within the frequency band of the receive signal. The limited combination of operating bands usable in a carrier aggregation configuration by the conventional front end circuitry 28 may impede the performance and versatility of the mobile device. Accordingly, front end circuitry for a mobile device is needed that is capable of reducing or eliminating undesirable interference between transmit and receive paths in carrier aggregation applications.

Figure 4:
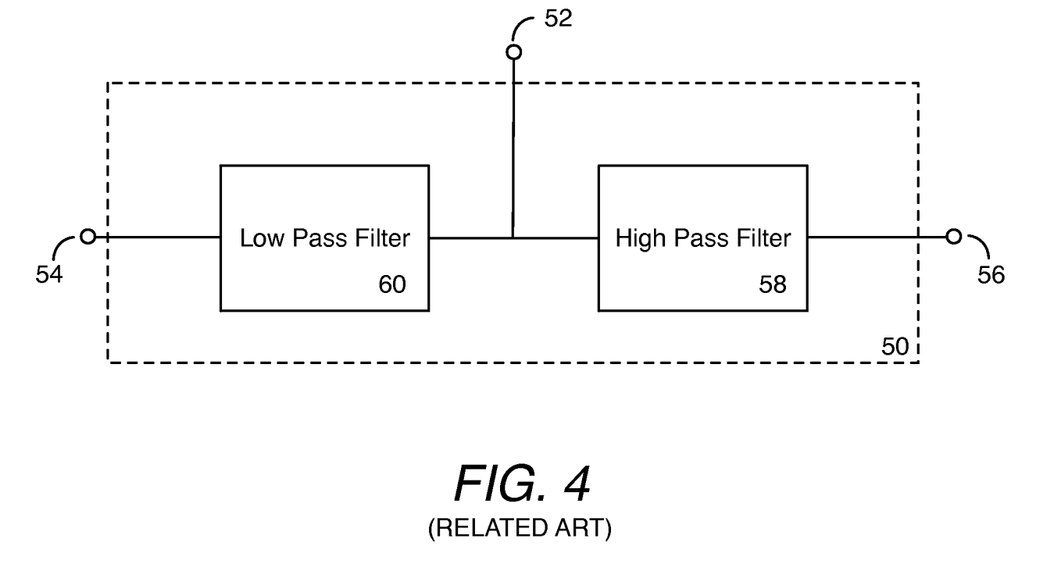
FIG. 4 is a schematic representation of a conventional diplexer.

FIG. 4 shows a conventional diplexer 50 for use in the conventional front end circuitry 28 shown in FIG. 3. The conventional diplexer 50 includes an antenna port 52, a low band port 54, a high band port 56, a high pass filter 58, and a low pass filter 60. The high pass filter 58 is adapted to pass high band signals about a high pass band between the antenna port 52 and the high band port 56, while attenuating signals outside of the high pass band. The low pass filter 60 is adapted to pass low band signals about a low pass band between the antenna port 52 and the low band port 54, while attenuating signals outside of the low pass band.

The conventional diplexer 50 allows a mobile terminal to transmit and receive a high band signal and a low band signal simultaneously, thereby increasing the data rate of the mobile device. Although effective at separating low and high band signals, the conventional diplexer 50 may only partially attenuate harmonic distortion about a passing signal. In certain carrier aggregation applications, the limited isolation characteristics of the conventional diplexer 50 may degrade the performance of a mobile device in which it is incorporated. Carrier aggregation applications may demand more precise control over the high and low pass bands, greater stop band attenuation, and lower insertion loss. To achieve the desired pass and stop bands, a seventh or eighth order Butterworth response may be required according to the conventional design. Such a high order filter is complex to implement, and further introduces a high amount of insertion loss into the signal path to the antenna.

Figure 5:
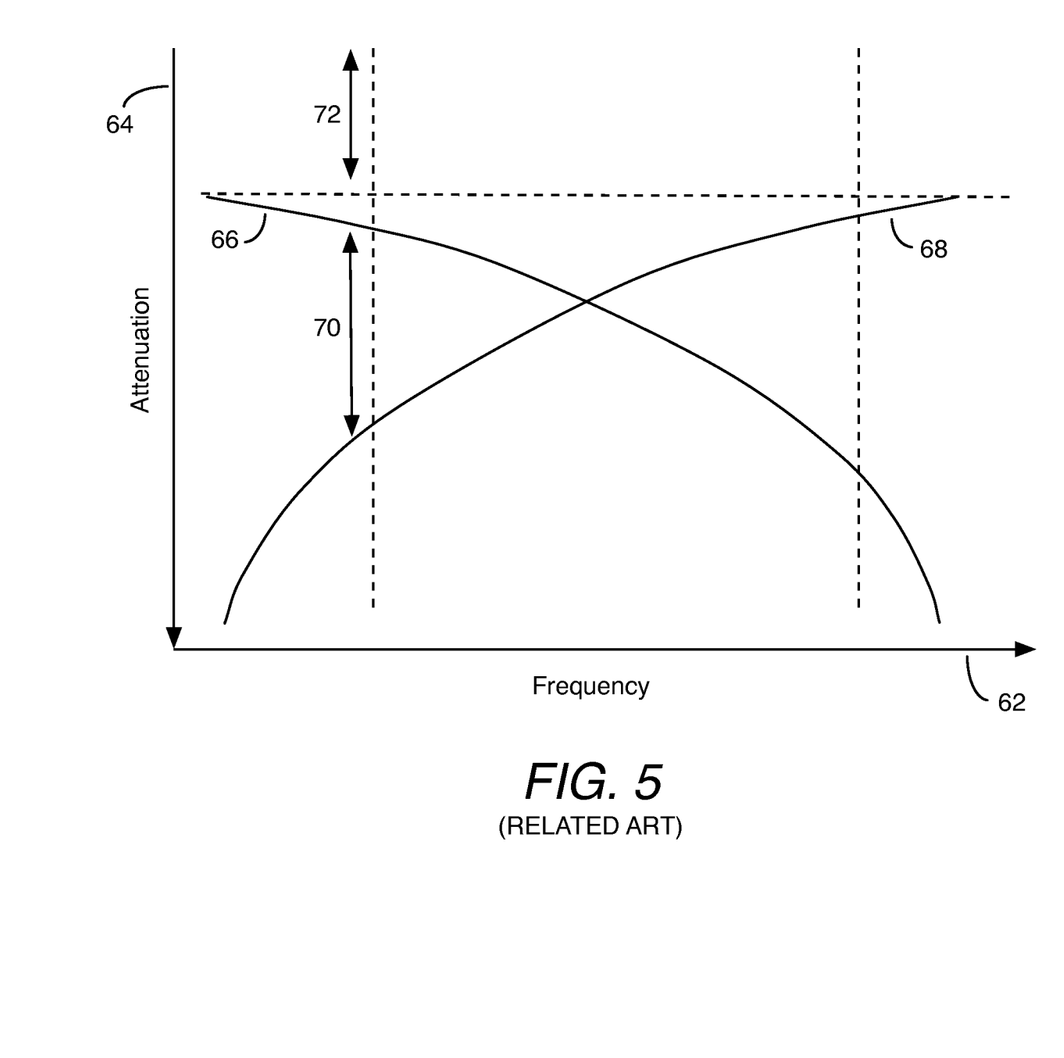
FIG. 5 is graph representing the filter response of a conventional high-order diplexer.
Figure 6:
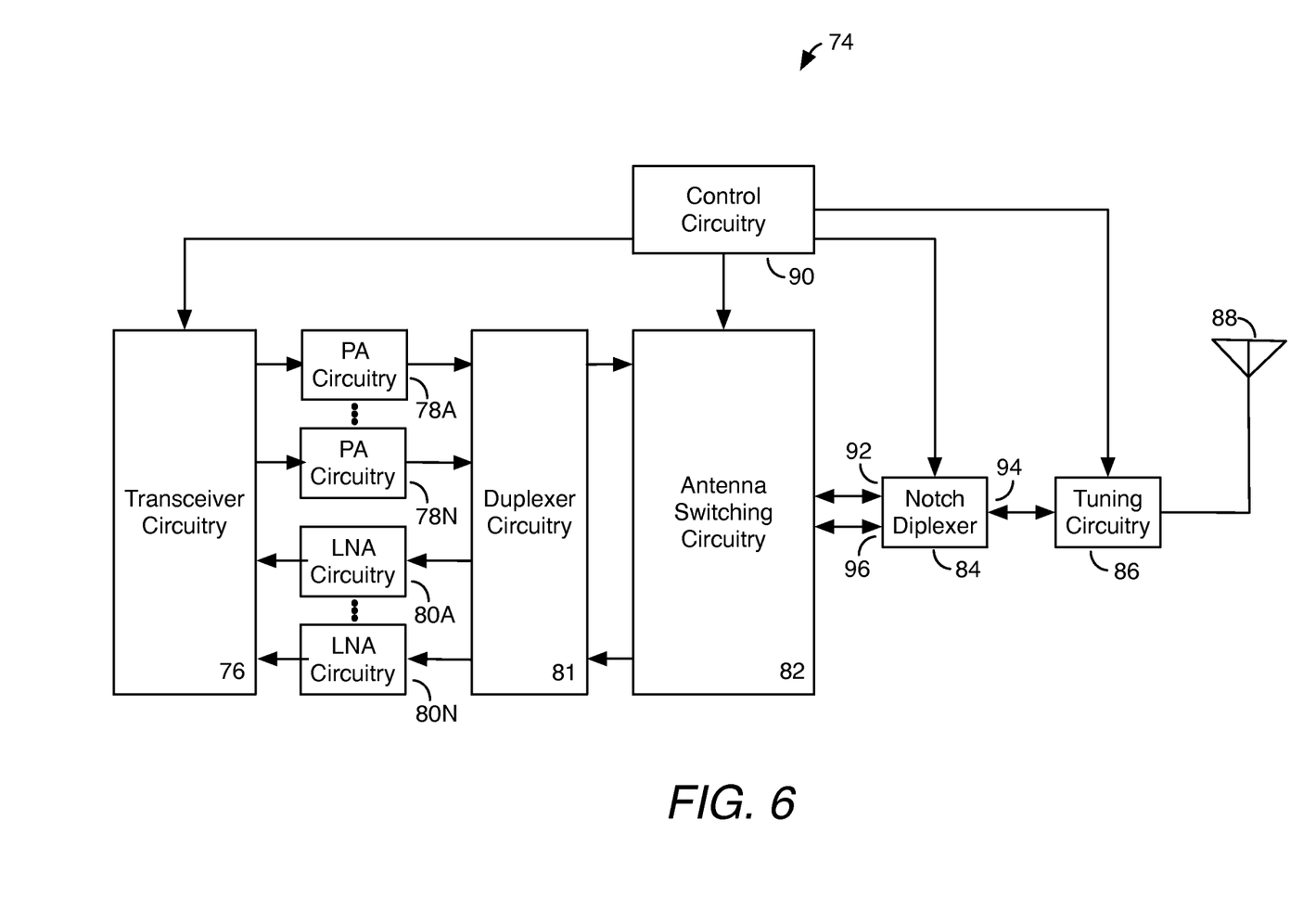
FIG. 6 is a schematic representation of radio frequency (RF) front end circuitry according to one embodiment of the present disclosure.

FIG. 5 shows a graph of the filter response for a diplexer using a high order number of filters. The x-axis 62 of the graph represents the frequency of a signal passed through the diplexer, while the y-axis 64 of the graph represents the attenuation associated with the signal path. As shown in FIG. 6, a low band signal path 66 provides low attenuation at low frequencies, while providing high attenuation at high frequencies. Further, a high band signal path 68 provides low attenuation at high frequencies while providing high attenuation at low frequencies. As discussed above, high order filters may be required to meet the demanding standards of carrier aggregation applications. Even with a high order filter, however, conventional diplexer circuitry may not provide adequate isolation characteristics 70 between the low band signal path 66 and the high band signal path 68. Further, insertion loss 72 associated with a high order diplexer may significantly degrade the performance of a mobile terminal in which it is integrated. Accordingly, a diplexer is needed that is capable of providing the necessary pass bands for the high band and low band signals while maintaining desirable stop band attenuation and insertion loss for carrier aggregation applications.

SUMMARY

Radio frequency (RF) front end circuitry includes a notch diplexer. The notch diplexer includes a high pass filter coupled between a high band port and an antenna port, and a low pass notch filter coupled between a low band port and the antenna port. The high pass filter is adapted to receive a high band receive signal having a high band carrier frequency at the antenna port, and pass the high band receive signal to the high band port. The low pass notch filter is adapted to receive a low band transmit signal having a low band carrier frequency at the low band port, and attenuate distortion in the low band transmit signal about a notch stop band before passing the low band transmit signal to the antenna port. According to one embodiment, the notch stop band includes the high band carrier frequency.

According to one embodiment, the RF front end circuitry is adapted for use in a carrier aggregation configuration. By attenuating distortion about the notch stop band, the notch diplexer reduces or eliminates undesirable interference caused by the use of carrier aggregation.

According to one embodiment, the notch diplexer includes a high band bypass switch and a low band bypass switch. The high band bypass switch is adapted to selectively bypass the high pass filter by coupling the high band port to the antenna port. The low band bypass switch is adapted to selectively bypass the low pass filter by coupling the low band port to the antenna port.

According to one embodiment, the high band bypass switch and the low band bypass switch are adapted to bypass the high pass filter and the low pass filter when the RF front end circuitry is in a normal mode of operation, while leaving the high pass filter and the low pass filter in the signal path of the antenna port when the RF front end circuitry is in a carrier aggregation mode of operation.

According to one embodiment, the high pass filter and the low pass filter are multiple order filters including at least two stages. The high band bypass switch and the low band bypass switch are adapted to selectively bypass one or more stages of the high pass filter and the low pass filter, respectively, such that at least one stage of the high pass filter and the low pass filter remains in the signal path of the antenna port.

According to one embodiment, the RF front end circuitry includes antenna switching circuitry. The antenna switching circuitry includes high band switching circuitry and low band switching circuitry. The low band switching circuitry includes a tunable notch filter adapted to selectively attenuate signals about a notch filter stop band, and a tunable capacitor adapted to adjust the notch stop band of the notch diplexer. According to one embodiment, the notch filter stop band includes the high band carrier frequency. By attenuating signals about the notch filter stop band, the tunable notch filter further reduces or eliminates undesirable interference caused by the use of carrier aggregation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Turning now to FIG. 6, a first embodiment of radio frequency (RF) front end circuitry 74 is shown that is suitable for use in carrier aggregation configurations. The basic architecture of the RF front end circuitry 74 includes transceiver circuitry 76, a plurality of power amplifiers 78A-78N, a plurality of low noise amplifiers 80A-80N, duplexer circuitry 81, antenna switching circuitry 82, a notch diplexer 84, antenna tuning circuitry 86, an antenna 88, and control circuitry 90. When receiving a signal, the antenna 88 of the RF front end circuitry 74 receives information bearing radio frequency signals at a receive frequency from one or more remote transmitters provided by a base station (not shown). The radio frequency signals pass through the antenna tuning circuitry 86 to the notch diplexer 84, where the signals are filtered into their low band and high band components and delivered to the antenna switching circuitry 82. The antenna switching circuitry 82 selectively couples one or more terminals of the notch diplexer 84 to one or more of the plurality of low noise amplifiers 80A-80N through the duplexer circuitry 81. One or more of the plurality of low noise amplifiers 80A-80N amplify the received components of the radio frequency signals and deliver them to the transceiver circuitry 76, where they may be subsequently processed and used by the RF front end circuitry 74.

On the transmit side, the transceiver circuitry 76 receives digitized data, which may represent voice, data, or control information. The encoded data is modulated to produce a carrier signal at a desired transmit frequency. The carrier signal is then delivered to one or more of the plurality of power amplifiers 78A-78N, where it is amplified and delivered to the antenna switching circuitry 82 through the duplexer circuitry 81. The antenna switching circuitry 82 selectively couples one or more output terminals of the plurality of power amplifiers 78A-78N to the notch diplexer 84. The carrier signal is then filtered by the notch diplexer 84, and delivered through the antenna tuning circuitry 86 to the antenna 88. The antenna tuning circuitry 86 is adapted to ensure optimal operation of the antenna 88 over a wide bandwidth. The control circuitry 90 is adapted to control one or more operating parameters of the transceiver circuitry 76, the antenna switching circuitry 82, the notch diplexer 84, or the antenna tuning circuitry 86.

In carrier aggregation configurations, the RF front end circuitry 74 may be adapted to simultaneously transmit a low band signal while receiving a high band signal, simultaneously receive a high band and low band signal, or simultaneously transmit a high band signal while receiving a low band signal. As discussed above, the simultaneous transmission of a low band signal and reception of a high band signal may cause undesirable interference between transmit and receive circuitry in the RF front end circuitry 74.

In filtering signals in the RF front end circuitry 74, the notch diplexer 84 is adapted to pass high band signals about a high pass band between a high band port 92 and an antenna port 94, pass low band signals about a low pass band between a low band port 96 and the antenna port 94, and attenuate signals outside of the respective high and low pass bands. The notch diplexer 84 is also adapted to attenuate signals about a notch stop band between the low band port 96 and the antenna port 94, as discussed in further detail below.

According to one embodiment, the notch stop band is designed to attenuate distortion in a low band transmit signal that falls within the frequency band of a high band receive signal. For example, the notch stop band may be designed to attenuate distortion within a band 8 transmit signal receiving that falls within a band 3 receive signal. Accordingly, the RF front end circuitry 74 may be adapted to operate in a carrier aggregation configuration using bands 8 and 3 (CA 8-3). As an additional example, the notch stop band may be designed to attenuate distortion within a band 17 transmit signal that falls within a band 4 receive signal. Accordingly, the RF front end circuitry 74 may be adapted to operate in a carrier aggregation configuration using bands 17 and 4 (CA 17-4).

By using the notch diplexer 84 in the RF front end circuitry 74, distortion about the carrier signal that may cause troublesome interference between transmit and receive circuitry is attenuated, thereby allowing the RF front end circuitry 74 to operate in any carrier aggregation configuration using a high band signal and a low band signal. For example, the RF front end circuitry 74 shown in FIG. 6 is usable in a carrier aggregation configuration using bands 3 and 8 (CA 3-8). When transmitting on band 8, the transceiver circuitry 76 will modulate a carrier signal from 880-915 MHz. The carrier signal will pass through one or more of the plurality of power amplifiers 78A-78N, where it will be amplified and delivered to the antenna switching circuitry 82 through the duplexer circuitry 81. The antenna switching circuitry 82 will place one or more output terminals of the plurality of power amplifiers 78A-78N in communication with the low band port 96 of the notch diplexer 84. Due to non-linearity of the switching components in the antenna switching circuitry 82, distortion about the carrier signal is generated. As the carrier signal is passed through the notch diplexer 84, the carrier signal is filtered by a low pass filter, and distortion about the carrier signal falling within the band 3 receive band (1805-1880) is further attenuated by the notch stop band. Accordingly, the signal at the antenna port 94 of the notch diplexer is virtually free of components that fall within the high pass band, thereby preventing signal leakage back from the antenna port 94 to the high band port 92 of the notch diplexer 84. By preventing signal leakage from the antenna port 94 to the high band port 92 during transmission of a signal on band 8, desensitization of the receive circuitry for band 3 is avoided, and the signal passed to the antenna 88 through the antenna tuning circuitry 86 is virtually free of harmonic distortion as a result of the antenna switching circuitry 82.

A similar result occurs in carrier aggregation configurations using bands 4 and 17 (CA 4-17), in devices simultaneously using band 13 and the GPS band, in devices simultaneously using band 26 and the 2.4 GHz ISM band, and in devices using GSM900 and GSM850 modes. As discussed above, the RF front end circuitry 74 shown in FIG. 6 is suitable for any carrier aggregation configuration that simultaneously uses a low band signal and a high band signal.

According to one embodiment, the notch diplexer 84 is tunable. The control circuitry 90 may be coupled to the notch diplexer 84 in order to alter one or more operating parameters of the notch diplexer 84. For example, the notch stop band of the notch diplexer 84 may be adjusted in order to specifically target distortion present in a low band transmit signal that falls within the frequency band of a high band receive signal.

Figure 7:
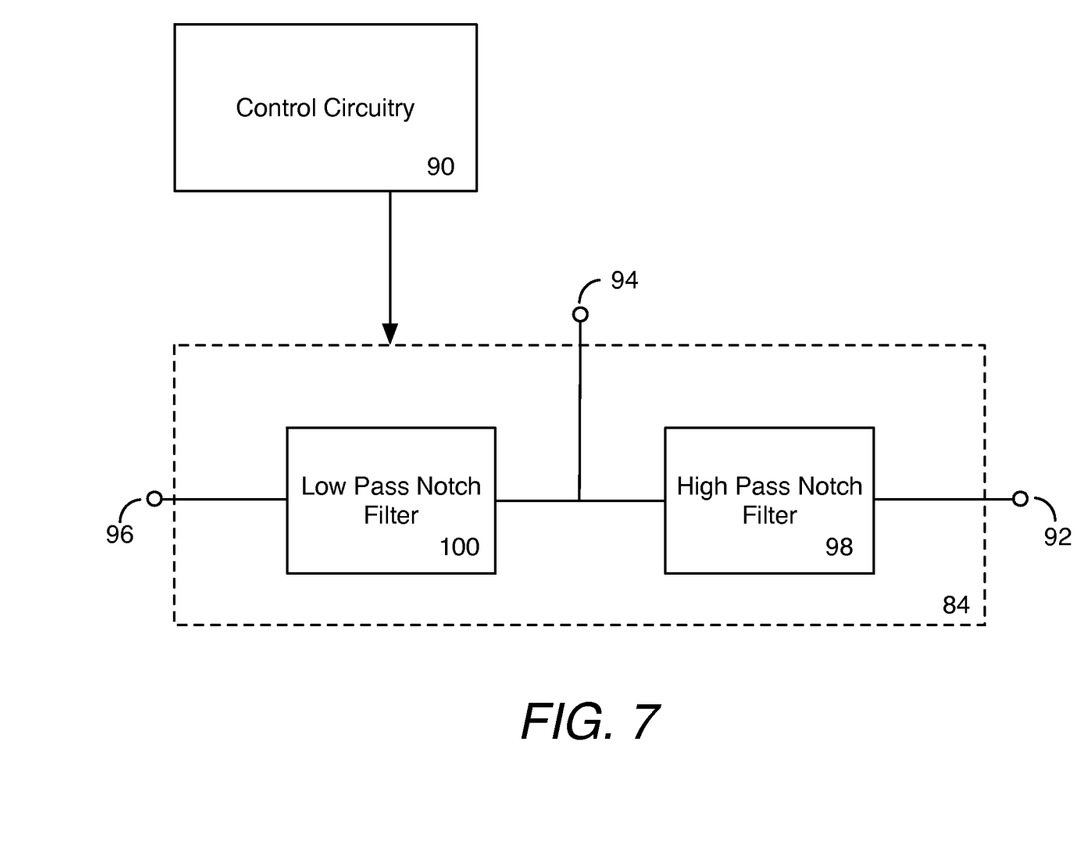
FIG. 7 is a schematic representation of a notch diplexer according to one embodiment of the present disclosure.

FIG. 7 shows details of the notch diplexer 84 according to one embodiment of the present disclosure. The notch diplexer 84 includes a high pass notch filter 98 coupled between the high band port 92 and the antenna port 94 and a low pass notch filter 100 coupled between the low band port 96 and the antenna port 94. For context, the control circuitry 90 is also shown. The high pass notch filter 98 is adapted to pass high band signals about a high pass band between the high band port 92 and the antenna port 94, while attenuating signals outside of the high pass band. Further, the high pass notch filter 98 may be adapted to further attenuate signals within a high notch stop band. The low pass notch filter 100 is adapted to pass low band signals about a low pass band between the low band port 96 and the antenna port 94, while attenuating signals outside of the low pass band. Further, the low pass notch filter 100 may be adapted to further attenuate signals within a low notch stop band. The low notch stop band may be designed to attenuate distortion within a low band transmit signal that falls within the frequency band of a high band receive signal. By attenuating signals about the low notch stop band, the low pass notch filter 100 reduces or eliminates signal leakage from the antenna port 94 to the high band port 92 as a result of distortion in the low band transmit signals. Accordingly, the notch diplexer 84 enables the RF front end circuitry 74 to operate in any carrier aggregation configuration that simultaneously uses a low band signal and a high band signal without desensitization of receive circuitry in the transceiver circuitry 76.

According to one embodiment, the notch diplexer 84 is tunable. The control circuitry 90 may be coupled to the notch diplexer 84 in order to alter one or more operating parameters of the notch diplexer 84. For example, the notch stop band of the notch diplexer 84 may be adjusted in order to specifically target distortion present in a low band transmit signal that falls within the frequency band of a high band receive signal.

Figure 8:
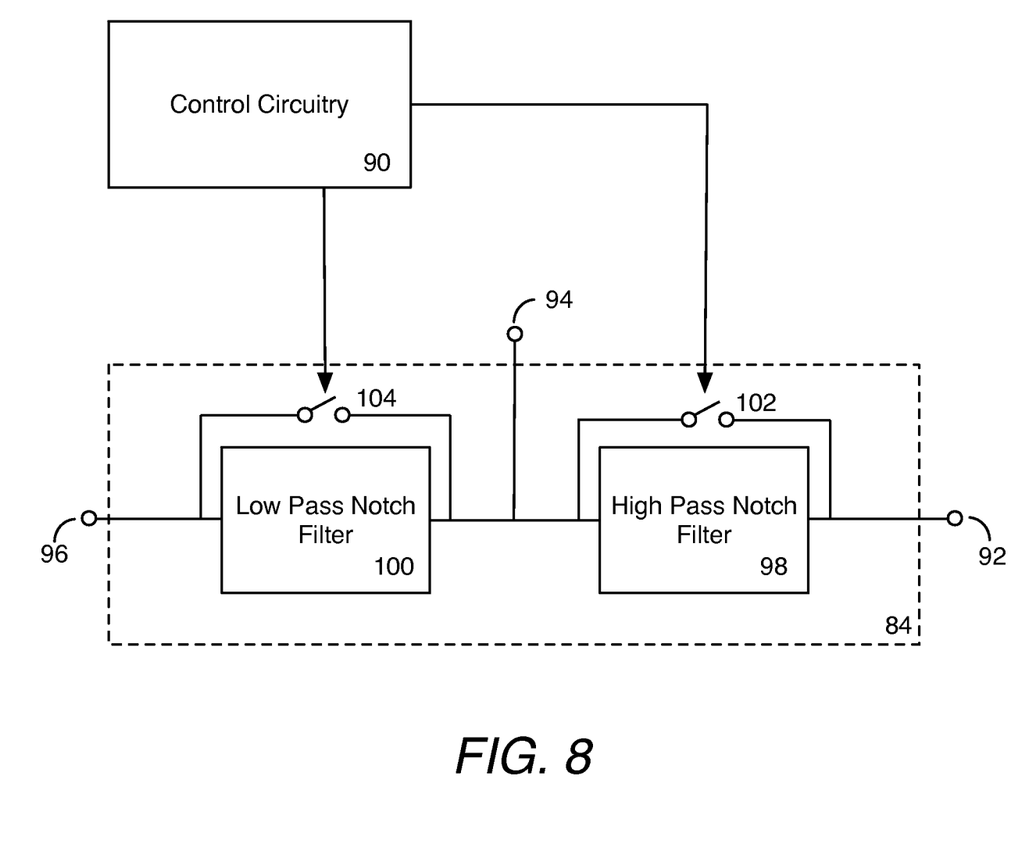
FIG. 8 is a schematic representation of an additional embodiment of a notch diplexer according to the present disclosure.

FIG. 8 shows details of the notch diplexer 84 according to an additional embodiment of the present disclosure. The notch diplexer 84 shown in FIG. 8 is substantially similar to that shown in FIG. 7, with the addition of a high band bypass switch 102 and a low band bypass switch 104. The high band bypass switch 102 is adapted to bypass the high pass notch filter 98 by selectively coupling the high band port 92 to the antenna port 94. The low band bypass switch 104 is adapted to selectively bypass the low pass notch filter 100 by selectively coupling the low band port 96 to the antenna port 94.

According to one embodiment, the RF front end circuitry 74 is adapted to operate in a normal mode of operation and a carrier aggregation mode of operation. In the normal mode of operation, the high band bypass switch 102 and the low band bypass switch 104 are in an ON state, such that the high pass notch filter 98 and the low pass notch filter 100 are bypassed. Accordingly, insertion loss as a result of the notch diplexer 84 is minimized. In the carrier aggregation mode of operation, the high band bypass switch 102 and the low band bypass switch 104 are in an OFF state, such that the high pass notch filter 98 and the low pass notch filter 100 remain in the signal path of the antenna port 94. Accordingly, the RF front end circuitry 74 maintains optimum efficiency during a normal mode of operation, while keeping the necessary filtering capacity to support all carrier aggregation configurations that simultaneously use a low band signal and a high band signal.

According to one embodiment, the control circuitry 90 is coupled to the high band bypass switch 102 and the low band bypass switch 104. The control circuitry 90 may be adapted to place the high band bypass switch 102 and the low band bypass switch 104 in an ON state during the normal mode of operation, and place the high band bypass switch 102 and the low band bypass switch 104 in an OFF state during the carrier aggregation mode of operation. Further, the control circuitry 90 may be adapted to independently operate the high band bypass switch 102 and the low band bypass switch 104.

Figure 9:
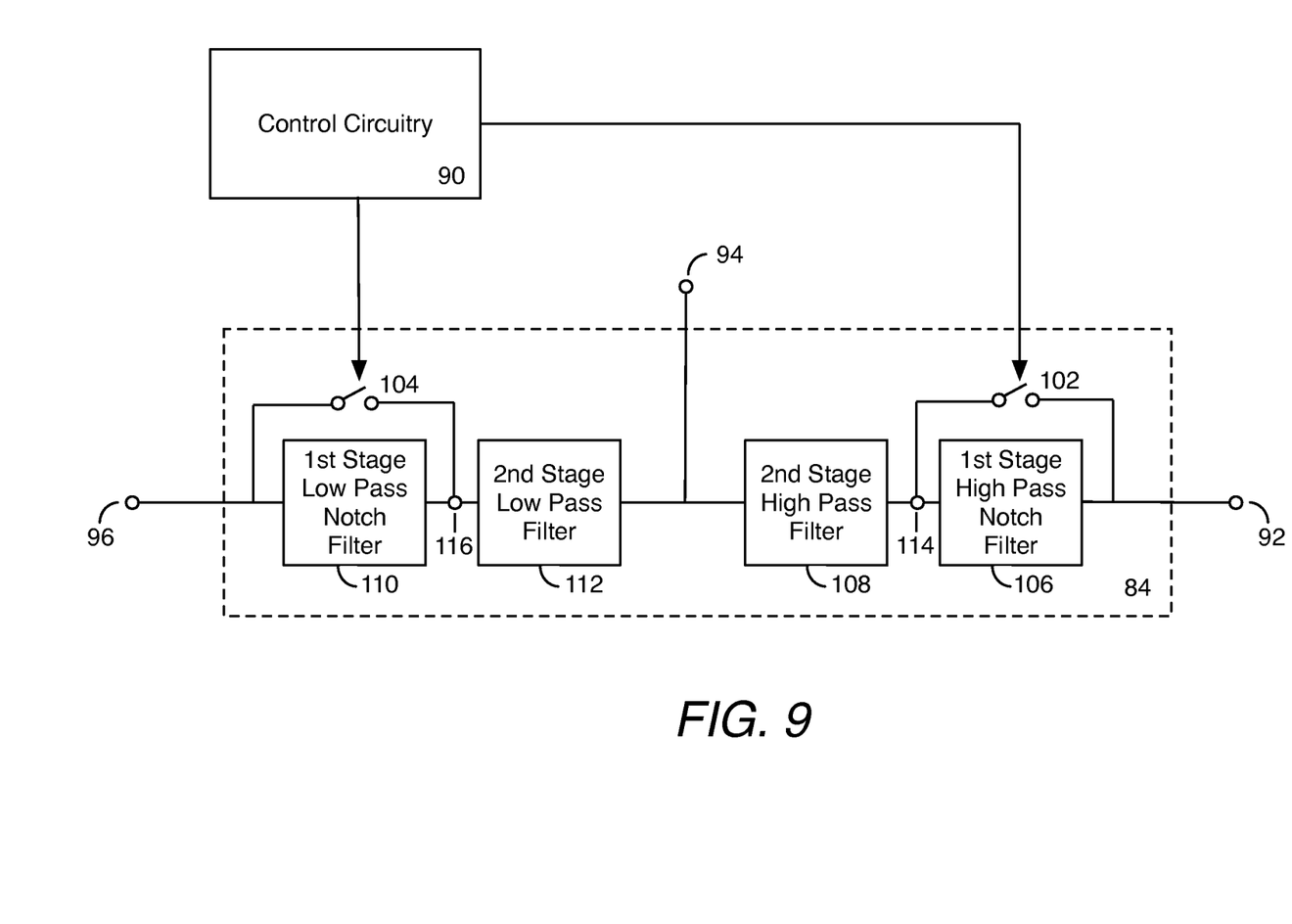
FIG. 9 is a schematic representation of an additional embodiment of a notch diplexer according to the present disclosure.

FIG. 9 shows details of the notch diplexer 84 according to an additional embodiment of the present disclosure. The notch diplexer 84 includes the high band port 92, the antenna port 94, the low band port 96, the high band bypass switch 102, the low band bypass switch 104, a first stage high pass notch filter 106, a second stage high pass filter 108, a first stage low pass notch filter 110, and a second stage low pass filter 112. The first stage high pass notch filter 106 is coupled between the high band port 92 and a high band filter port 114, and is adapted to pass high band signals about a high pass band between the high band port 92 and the high band filter port 114, while attenuating signals outside of the high pass band. The first stage high pass notch filter 106 may be adapted to further attenuate signals falling within a high notch stop band. The second stage high pass filter 108 is coupled between the high band filter port 114 and the antenna port 94, and is adapted to pass high band signals about the high pass band between the high band filter port 114 and the antenna port 94, while attenuating signals outside of the high pass band. The high band bypass switch 102 is coupled between the high band port 92 and the high band filter port 114. The high band bypass switch 102 is adapted to selectively bypass the first stage high pass notch filter 106 by coupling the high band port 92 to the high band filter port 114.

The first stage low pass notch filter 110 is coupled between the low band port 96 and a low band filter port 116, and is adapted to pass low band signals about a low pass band between the low band port 96 and the low band filter port 116, while attenuating signals outside of the low pass band. The first stage low pass notch filter 110 may be adapted to further attenuate signals falling within a low notch stop band. According to one embodiment, the low notch stop band is designed to attenuate distortion in a low band transmit signal that falls within the frequency band of a high band receive signal. The second stage low pass filter 112 is coupled between the low band filter port 116 and the antenna port 94, and is adapted to pass low band signals about the low pass band between the low band filter port 116 and the antenna port 94, while attenuating signals outside of the low pass band. The low band bypass switch 104 is coupled between the low band port 96 and the low band filter port 116, and is adapted to selectively bypass the first stage low pass notch filter 110 by coupling the low band port 96 to the low band filter port 116.

According to one embodiment, the RF front end circuitry 74 is adapted to operate in a normal mode of operation and a carrier aggregation mode of operation. In the normal mode of operation, the high band bypass switch 102 and the low band bypass switch 104 are in an ON state, such that the first stage high pass notch filter 106 and the first stage low pass notch filter 110 are bypassed. Accordingly, insertion loss as a result of the notch diplexer 84 is minimized, while maintaining a degree of filtration in the signal path of the antenna for minimizing distortion. In the carrier aggregation mode of operation, the high band bypass switch 102 and the low band bypass switch 104 are in an OFF state, such that the first stage high pass notch filter 106 and the first stage low pass filter 110 remain in the signal path of the antenna port 94. Accordingly, the RF front end circuitry 74 maintains optimum efficiency during a normal mode of operation, while keeping the necessary filtering capacity to support all carrier aggregation configurations that simultaneously use a low band signal and a high band signal.

According to one embodiment, the control circuitry 90 is coupled to the high band bypass switch 102 and the low band bypass switch 104. The control circuitry 90 may be adapted to place the high band bypass switch 102 and the low band bypass switch 104 in an ON state during a normal mode of operation, and place the high band bypass switch 102 and the low band bypass switch 104 in an OFF state during a carrier aggregation mode of operation. Further, the control circuitry 90 may be adapted to independently operate the high band bypass switch 102 and the low band bypass switch 104.

Figure 10:
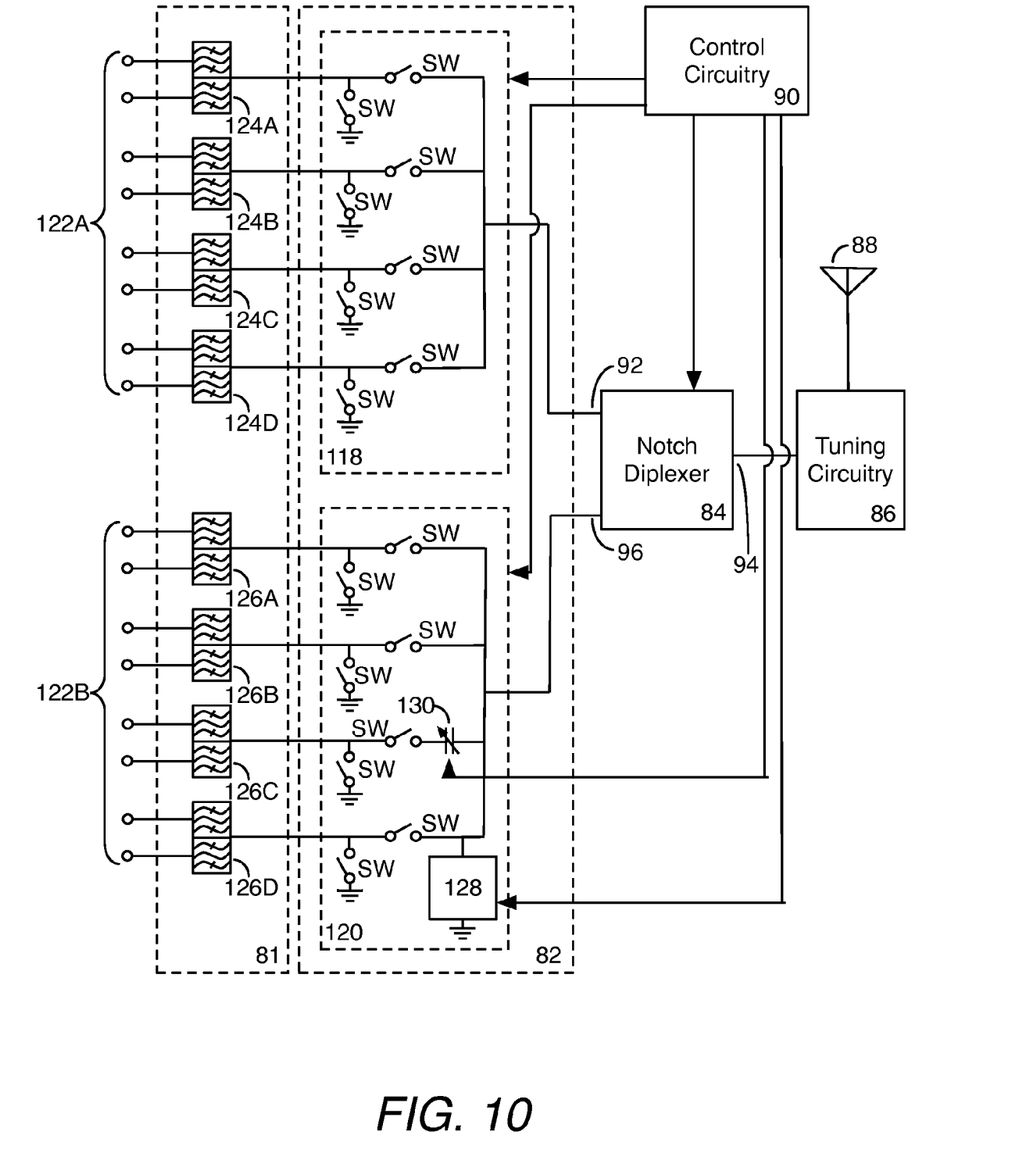
FIG. 10 is a schematic representation of antenna switching circuitry according to one embodiment of the present disclosure.

FIG. 10 shows details of the duplexer circuitry 81 and the antenna switching circuitry 82 according to one embodiment of the present disclosure. The antenna switching circuitry 82 includes high band switching circuitry 118, low band switching circuitry 120, one or more high band RF front end ports 122A and one or more low band RF front end ports 122B (referred to collectively as the RF front end ports 122), a tunable notch filter 128, and a tunable capacitor 130. The duplexer circuitry 81 includes one or more high band duplexers 124A-124D (referred to collectively as the high band duplexers 124) and one or more low band duplexers 126A-126N (referred to collectively as the low band duplexers 126). For context, the notch diplexer 84, the antenna tuning circuitry 86, the antenna 88, and the control circuitry 90 are also shown. The high band switching circuitry 118 may comprise one or more single-pole multi-throw (SPMT) switches SW adapted to selectively couple one or more of the high band RF front end ports 122A to the high band port 92 of the notch diplexer 84 through the high band duplexers 124. The low band switching circuitry 120 may comprise one or more SPMT switches SW adapted to selectively couple one or more of the low band RF front end ports 122B to the low band port 96 of the notch diplexer 84 through the low band duplexers 126.

Each switch SW in the high band switching circuitry 118 and the low band switching circuitry 120 may be associated with a single operating band. Although eight switches SW are shown in both the high band switching circuitry 118 and the low band switching circuitry 120, any number of switches SW may be used in the high band switching circuitry 118 and the low band switching circuitry 120. Further, the switches SW may be arranged in any configuration without departing from the principles of the present disclosure. For instance, the switches SW may be implemented as a single bank of switches, or may be separated into separate banks and cascaded in series.

The high band duplexers 124 and the low band duplexers 126 may be adapted to separate transmit and receive signals such that transmit signals are passed from one of the RF front end ports 122 to the antenna switching circuitry 82, and receive signals are passed from the antenna switching circuitry 82 to the appropriate port in the RF front end ports 122. The high band duplexers 124 and the low band duplexers 126 may comprise any suitable filtering elements. For example, the high band duplexers 124 and the low band duplexers 126 may comprise surface acoustic wave (SAW) duplexers or bulk acoustic wave (BAW) duplexers. The RF front end ports 122 may be coupled to power amplifier circuitry (in the case of a transmit port) or low noise amplifier circuitry (in the case of a receive port). The coupled power amplifier circuitry or low noise amplifier circuitry may be associated with a single operating band.

The tunable notch filter 128 is coupled between the low band switching circuitry 120 and a fixed voltage. The tunable notch filter 128 may be adapted to filter low band signals to attenuate undesirable distortion about a notch filter stop band. For example, the tunable notch filter 128 may be adapted to attenuate distortion in a low band transmit signal that falls within the frequency band of a high band receive signal. By using the tunable notch filter 128 in addition to the notch diplexer 84, undesirable distortion about the frequency band of a high band receive signal is further reduced, thereby preventing signal leakage from the antenna port 94 to the high band port 92 of the notch diplexer 84 during transmission of a low band signal. Accordingly, desensitization of receive circuitry within the transceiver circuitry 76 is avoided.

The tunable capacitor 130 may be placed in series with any switch within the low band switching circuitry 120. By placing a capacitance in series with the low pass notch filter 100 in the notch diplexer 84, the tunable capacitor 130 may be adapted to adjust the notch stop band of the notch diplexer 84 in order to obtain desirable isolation and insertion loss characteristics. According to one embodiment, the tunable capacitor 130 is placed in series with a switch SW in the low band switching circuitry 120 that is adapted to pass a low band transmit signal having harmonics that fall within the frequency band of a high band receive signal. In doing so, desirable performance characteristics of the notch diplexer 84 are obtained in carrier aggregation configurations where one or more harmonics of the transmit signal fall within the operating band of the receive signal, and the effect on other operating bands within the low band switching circuitry 120 is minimized.

As will be appreciated by those of ordinary skill in the art, the tunable capacitor 130 may be any component having an adjustable capacitance. According to one embodiment, the tunable capacitor 130 is a programmable array of capacitors (PAC).

Figure 11:
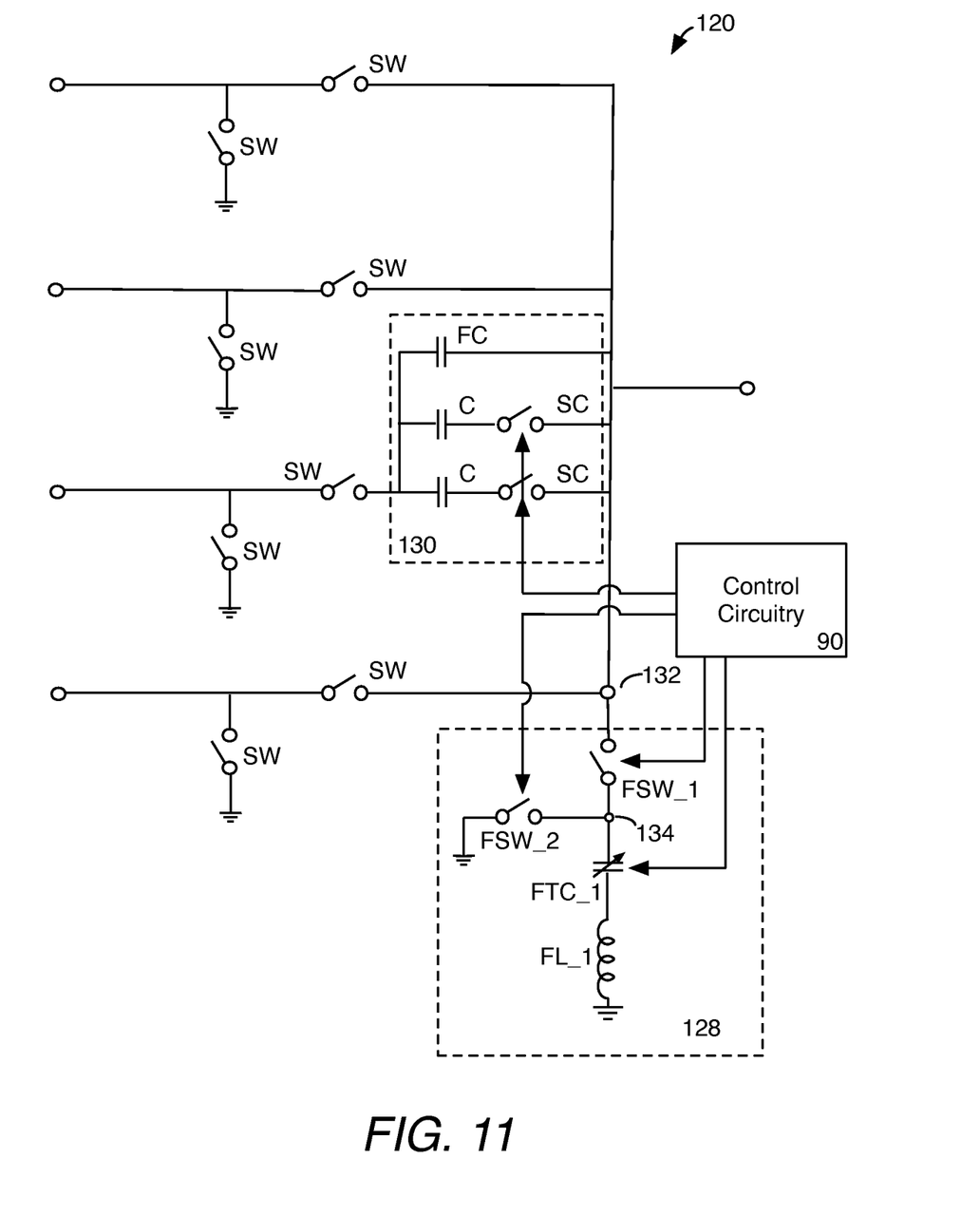
FIG. 11 is a schematic representation showing further details of the low band switching circuitry according to one embodiment of the present disclosure.

FIG. 11 shows a schematic representation of the low band switching circuitry 120 including further details of the tunable notch filter 128 and the tunable capacitor 130. For context, the control circuitry 90 is also shown. The tunable notch filter 128 includes a first filter switch FSW_1, a second filter switch FSW_2, a filter tunable capacitor FTC_1, and a filter inductor FL_1. The first filter switch FSW_1 is coupled between an input node 132 and a tuning node 134. The second filter switch FSW_2 is coupled between the tuning node 134 and ground. The filter tunable capacitor FTC_1 and the filter inductor FL_1 are coupled in series between the tuning node 134 and ground. According to one embodiment, the first filter switch FSW_1 and the second filter switch FSW_2 are coupled to the control circuitry 90. The control circuitry may be adapted to place the first filter switch FSW_1 and the second filter switch FSW_2 in an OFF state during a normal mode of operation of the RF front end circuitry 74, and place the first filter switch FSW_1 and the second filter switch FSW_2 in an ON state during a carrier aggregation mode of operation of the RF front end circuitry 74. The control circuitry 90 may also be coupled to the filter tunable capacitor FTC_1 in order to control a notch filter stop band associated with the tunable notch filter 128.

According to one embodiment, the tunable capacitor is a programmable array of capacitors (PAC) including two or more switchable capacitors coupled in parallel with a fixed capacitor FC. Each switchable capacitor may include a fixed capacitor C and a switch SC. Each one of the switches SC in the switchable capacitors may be coupled to the control circuitry 90. The control circuitry 90 may be adapted to adjust the capacitance of the tunable capacitor 130 by changing the state of each one of the switches SC. Although two switchable capacitors are shown in FIG. 11, any number of switchable capacitors, including any number of capacitors and switches may be used without departing from the principles of the present disclosure.

Figure 12:
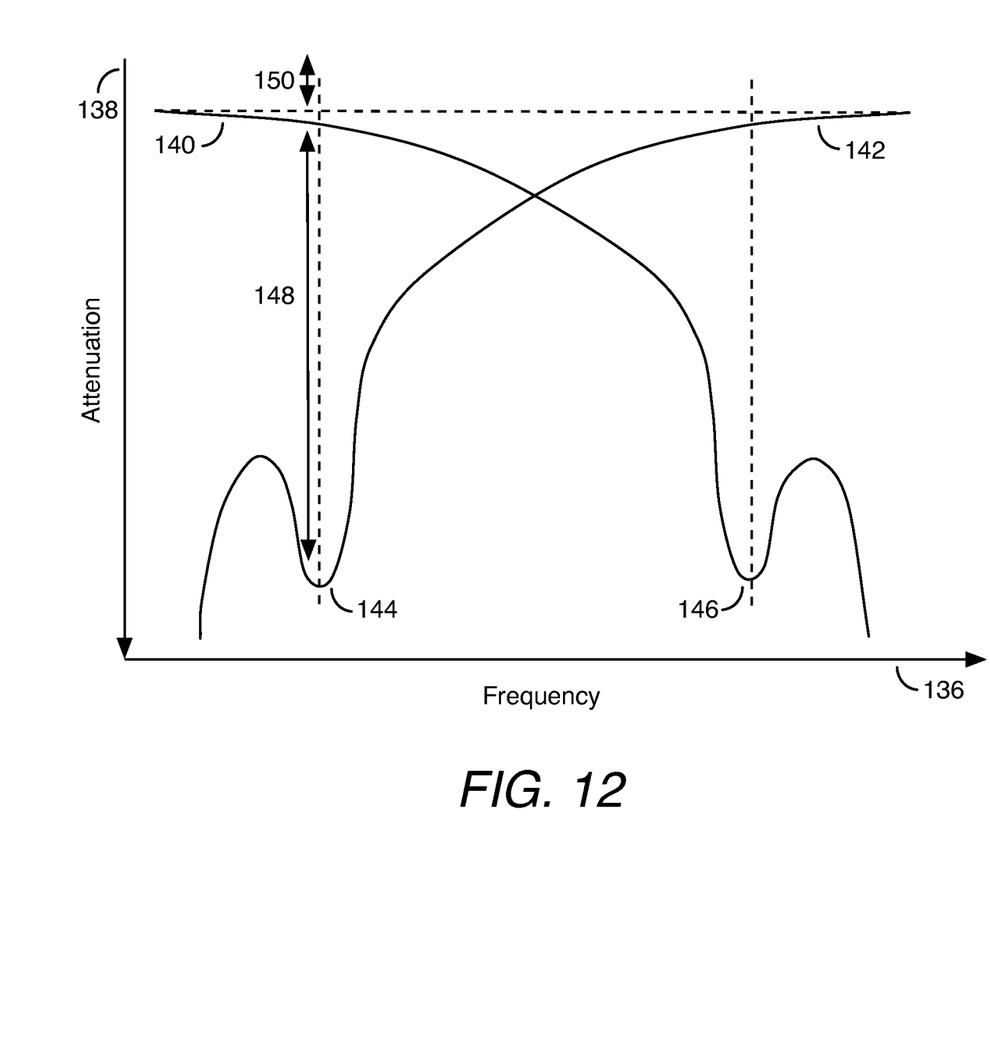
FIG. 12 is a graph representing the filter response of a notch diplexer according to one embodiment of the present disclosure.

FIG. 12 shows a graph illustrating the filter response of the notch diplexer 84 according to one embodiment of the present disclosure. The x-axis 136 of the graph represents the frequency of a signal passed through the notch diplexer 84, while the y-axis 138 of the graph represents the attenuation associated with the signal path through the notch diplexer 84. Specifically, a low band signal path 140 provides little to no attenuation at low frequencies, while providing high attenuation at high frequencies. A high band signal path 142 provides little to no attenuation at high frequencies, while providing high attenuation at low frequencies. As previously discussed, the notch diplexer 84 may be associated with a high notch stop band 144 and a low notch stop band 146, which provide additional attenuation at specific high and low frequencies, respectively. According to one embodiment, the low notch stop band 146 is designed to attenuate distortion in the low band signal path that falls within the frequency band of a high band receive signal. By using the low notch stop band 146, the notch diplexer 84 prevents signal leakage from the antenna port 94 to the high band port 92 of the notch diplexer 84 during transmission of a low band signal, thereby avoiding desensitization of receive circuitry in the transceiver circuitry 76. As shown in FIG. 12, the notch diplexer 84 provides excellent isolation 148 characteristics, while maintaining a low insertion loss 150.

Those skilled in the art will recognize improvements and modifications to the preferred embodiments of the present disclosure. All such improvements and modifications are considered within the scope of the concepts disclosed herein and the claims that follow.

What is claimed is:

1. A notch diplexer comprising:
    a high pass filter coupled between a high band port and an antenna port and adapted to receive a high band receive signal having a high band carrier frequency at the antenna port, and pass the high band receive signal to the high band port; and
    a low pass notch filter coupled between a low band port and the antenna port and adapted to receive a low band transmit signal having a low band carrier frequency at the low band port, and attenuate distortion in the low band transmit signal about a notch stop band, wherein the notch stop band includes the high band carrier frequency.

2. The notch diplexer of claim 1 wherein the low pass notch filter is further adapted to pass the low band transmit signal to the antenna port.

3. The notch diplexer of claim 1 further comprising:
    a high band bypass switch coupled between the high band port and the antenna port; and
    a low band bypass switch coupled between the low band port and the antenna port.

4. The notch diplexer of claim 3 wherein:
    the high band bypass switch is adapted to selectively bypass the high pass filter by coupling the high band port to the antenna port; and the low band bypass switch is adapted to selectively bypass the low pass filter by coupling the low band port to the antenna port.

5. The notch diplexer of claim 4 further comprising control circuitry adapted to:
   place the high band switch and the low band switch in an ON state in order to bypass the high pass filter and the low pass notch filter in a normal mode of operation of the notch diplexer; and
   place the high band switch and the low band switch in an OFF state in a carrier aggregation mode of operation of the notch diplexer.

6. The notch diplexer of claim 1 wherein:
   the high pass filter comprises a first stage high pass filter coupled between the high band port and a high band filter node and a second stage high pass filter coupled between the high band filter node and the antenna port; and
   the low pass notch filter comprises a first stage low pass notch filter coupled between the low band port and a low band filter node and a second stage low pass filter coupled between the low band filter node and the antenna node.

7. The notch diplexer of claim 6 further comprising:
   a high band bypass switch coupled between the high band port and the high band filter node; and
   a low band bypass switch coupled between the low band port and the low band filter node.

8. The notch diplexer of claim 7 wherein:
   the high band bypass switch is adapted to selectively bypass the first stage high pass filter by coupling the high band port to the high band filter node; and
   the low band bypass switch is adapted to selectively bypass the first stage low pass notch filter by coupling the low band port to the low band filter node.

9. The notch diplexer of claim 8 further comprising control circuitry adapted to:
   place the high band bypass switch and the low band bypass switch in an ON state in order to bypass the first stage high pass filter and the first stage low pass notch filter in a normal mode of operation of the notch diplexer; and
   place the high band bypass switch and the low band bypass switch in an OFF state in a carrier aggregation mode of operation of the notch diplexer.

10. The notch diplexer of claim 1 wherein the notch diplexer is adapted to operate in a carrier aggregation mode of operation.

11. The notch diplexer of claim 10 wherein the high band carrier frequency is about 1805-1880 MHz, and the low band carrier frequency is about 880-915 MHz.

12. The notch diplexer of claim 10 wherein the high band carrier frequency is about 2110-2155 MHz, and the low band carrier frequency is about 704-716 MHz.

13. Radio frequency (RF) front end circuitry comprising:
   a notch diplexer comprising:
      a high pass filter coupled between a high band port and an antenna port and adapted to receive a high band receive signal having a high band carrier frequency at the antenna port, and pass the high band receive signal to the high band port; and
      a low pass notch filter coupled between a low band port and the antenna port and adapted to receive a low band transmit signal having a low band carrier frequency at the low band port, and attenuate distortion in the low band transmit signal about a notch stop band, wherein the notch stop band includes the high band carrier frequency;
   antenna switching circuitry;
   a plurality of high band RF front end ports; and
   a plurality of low band RF front end ports.

14. The RF front end circuitry of claim 13 wherein the antenna switching circuitry comprises:
   high band switching circuitry coupled between the plurality of high band RF front end ports and the high band port of the notch diplexer and adapted to selectively couple one of the plurality of high band RF front end ports to the high band port of the notch diplexer; and
   low band switching circuitry coupled between the plurality of low band RF front end ports and the low band port of the notch diplexer and adapted to selectively couple one of the plurality of low band RF front end ports to the low band port of the notch diplexer.

15. The RF front end circuitry of claim 14 further comprising a tunable notch filter coupled between the low band switching circuitry and a fixed voltage node.

16. The RF front end circuitry of claim 15 wherein the tunable notch filter is adapted to attenuate distortion in the low band transmit signal about a notch filter stop band, wherein the notch filter stop band includes the high band carrier frequency.

17. The RF front end circuitry of claim 14 wherein the low band switching circuitry comprises a plurality of series switches coupled between the plurality of low band RF front end ports and the low band port of the notch diplexer.

18. The RF front end circuitry of claim 17 further comprising a tunable capacitor coupled between one or more of the plurality of series switches and the low band port of the notch diplexer.

19. The RF front end circuitry of claim 18 wherein the tunable capacitor is adapted to adjust the notch stop band of the notch diplexer.

20. The RF front end circuitry of claim 19 wherein the tunable capacitor is a programmable array of capacitors (PAC).

21. The RF front end circuitry of claim 13 wherein the RF front end circuitry is adapted to operate in a carrier aggregation mode of operation.

22. The RF front end circuitry of claim 21 wherein the high band carrier frequency is about 1805-1880 MHz, and the low band carrier frequency is about 880-915 MHz.

23. The RF front end circuitry of claim 21 wherein the high band carrier frequency is about 2110-2155 MHz, and the low band carrier frequency is about 704-716 MHz.

* * * * *